US005730804A

United States Patent [19]
Gomi et al.

[11] Patent Number: 5,730,804
[45] Date of Patent: Mar. 24, 1998

[54] PROCESS GAS SUPPLY APPARATUS

[75] Inventors: Hisashi Gomi, Nirasaki; Masahide Itoh, Yamanashi-ken; Shimpei Jinnouchi, Nirasaki; Towl Ikeda, Tomisatomachi, all of Japan

[73] Assignee: Tokyo Electron Limited, Tokyo, Japan

[21] Appl. No.: 772,570

[22] Filed: Dec. 26, 1996

[30] Foreign Application Priority Data

Dec. 27, 1995 [JP] Japan .................. 7-351796

[51] Int. Cl.$^6$ .................. C23C 16/00
[52] U.S. Cl. .................. 118/726; 118/715; 134/22.12; 134/22.14; 134/22.18; 134/22.19
[58] Field of Search .................. 118/715, 726; 156/345; 134/22.12, 22.14, 22.18, 22.19, 115 R

[56] References Cited

FOREIGN PATENT DOCUMENTS 3-245883  11/1991  Japan .
7-58034   3/1995   Japan .

*Primary Examiner*—Richard Bueker
*Attorney, Agent, or Firm*—Oblon, Spivak, McClelland, Maier & Neustadt, P.C.

[57] ABSTRACT

A process gas supply apparatus according to the invention comprises a supply pipe line connecting a supply source containing an organic aluminum metallic compound in a liquid state, to a process device for forming a film on an object using the organic aluminum metallic compound, a force-feed device for force-feeding, through the supply pipe line, the organic aluminum metallic compound contained in the supply source, a vaporizing device provided across the supply pipe line for vaporizing the force-fed organic aluminum metallic compound of the liquid state, a purge gas introduction device connected to the supply pipe line for introducing a pressurized purge gas into the supply pipe line, a solvent introduction device connected to the supply pipe line for introducing into the supply pipe line a solvent for dissolving the organic aluminum metallic compound, an exhaustion device connected to the supply pipe line for exhausting the supply pipe line by a negative pressure, and a control device having a plurality of valves arranged across the supply pipe line, and controlling the flow of fluids flowing through the supply pipe line by opening and closing the valves.

21 Claims, 5 Drawing Sheets

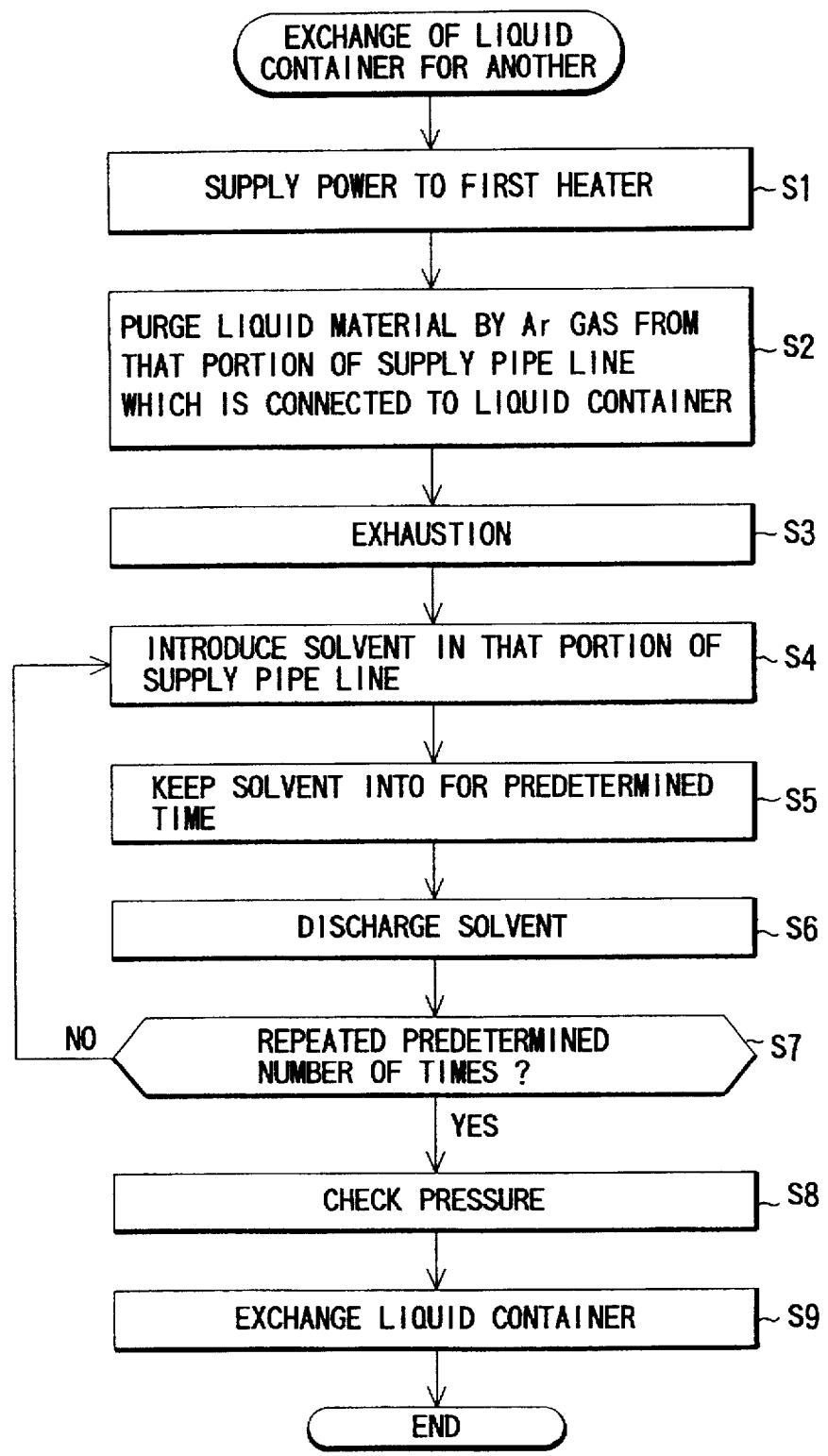
F I G. 3

PROCESS GAS SUPPLY APPARATUS

BACKGROUND OF THE INVENTION

This invention relates to a process gas supply apparatus for vaporizing a liquid of a high viscosity and supplying it, for example, to a semiconductor manufacturing device, and more particularly to a process gas supply apparatus capable of purging the liquid therefrom by cleaning.

In general, the circuit of a semiconductor device tends to have a multilayer structure in accordance with a recent demand for high densification and integration. In the multilayer structure, a technique for filling a contact hole as a junction between a lower device layer and an upper Al wiring layer, or a via hole as a junction between a lower Al wiring layer and an upper Al wiring layer is regarded important to electrically connect a wire to a device, or connect wires to each other.

It is preferable to fill the contact hole or the via hole with a cheap and highly conductive material such as aluminum. Further, in this case, in light of technical limitation to prevent occurrence of voids, it is more desirable to perform CVD (Chemical Vapor Deposition) which can realize excellent step coverage, than to perform sputtering which can form a highly-oriented film.

At the time of forming an Al film on a semiconductor wafer by CVD, DMAH (dimethyl aluminum hydride) gas, an organometallic gas, is generally used as a process gas. DMAH is very hard to handle, since it has a very high viscosity of about 8000 to 10000 cp at an ordinary temperature, and furiously reacts with moisture or oxygen contained in the air and burns.

Methods for vaporizing a liquid material and supplying the vaporized gas as the process gas generally include a bubbling method, a baking method and a direct vaporization method. In the bubbling method, which is shown in FIG. 5A, a carrier gas such as $N_2$ gas, having its flow controlled by a mass-flow controller 6, is supplied into a liquid material 2 contained in a liquid container 4, and a process gas resulting from bubbling is carried by the carrier gas into a process device. In the baking method, which is shown in FIG. 5B, the liquid container 4 with the liquid material 2 and the mass-flow controller 6 for controlling the flow of the process gas are received in an oven 8 and heated, thereby directly vaporizing the liquid material 2 with heat and force-feeding a resultant material gas as a process gas by its own pressure into a process device. In the direct vaporization method, which is shown in FIG. 5C, a pressurized gas is supplied into the liquid container 4 with the liquid material 2, thereby force-feeding the liquid material itself. The pressurized liquid material with its flow controlled by a liquid flow controller 10 is guided into a carburetor 12, where the liquid material is vaporized by a carrier gas having its flow controlled by the mass-flow controller 6, and supplied into a process device.

While the film forming processing is repeated, various types of troubles may occur in the process gas supply system. To avoid this, it is necessary to regularly or irregularly inspect the carburetor, the flow control mechanism, pipes, etc. provided in the supply system. At the time of such an inspection for maintenance, however, the carburetor or the flow control mechanism cannot easily be detached from the pipes, since DMAH, if it remains in the supply system and is exposed to the air, will furiously react with moisture contained in the air. Such a furious chemical reaction may well occur when the liquid container in which the amount of DMAH is reduced is exchanged for another filled with the same.

To prevent the chemical reaction, it is considered that pressurized gas is supplied into the supply system to purge remaining liquid DMAH to the outside of the system. However, since as aforementioned, the viscosity of DMAH is rather high at an ordinary temperature, the amount of DMAH which can be purged by the pressurized gas is limited. Accordingly, there may well be a case where even if the pressurized gas is introduced into the supply system, DMAH cannot completely be purged to the outside of the system and a considerable amount of DMAH remains on the inner surface of a pipe incorporated in the supply system.

BRIEF SUMMARY OF THE INVENTION

It is the object of the invention to provide a process gas supply apparatus capable of efficiently and completely removing an organic aluminum metallic compound remaining therein.

To attain the object, there is provided a process gas supply apparatus comprising: a supply pipe line connecting a supply source containing an organic aluminum metallic compound in a liquid state, to a process device for forming a film on an object using the organic aluminum metallic compound; force-feed means for force-feeding, through the supply pipe line, the organic aluminum metallic compound contained in the supply source; vaporizing means provided across the supply pipe line for vaporizing the force-fed organic aluminum metallic compound of the liquid state; purge gas introduction means connected to the supply pipe line for introducing a pressurized purge gas into the supply pipe line; solvent introduction means connected to the supply pipe line for introducing into the supply pipe line a solvent for dissolving the organic aluminum metallic compound; exhaustion means connected to the supply pipe line for exhausting the supply pipe line by a negative pressure; and control means having a plurality of valves arranged across the supply pipe line, and controlling the flow of fluids flowing through the supply pipe line by opening and closing the valves.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 3 is a flowchart, illustrating a procedure of purging a liquid material, by cleaning, at the time of exchanging a liquid container incorporated in the process gas supply apparatus of FIG. 1;

DETAILED DESCRIPTION OF THE INVENTION

The embodiments of the invention will be described with reference to the accompanying drawings.

Figure 1:
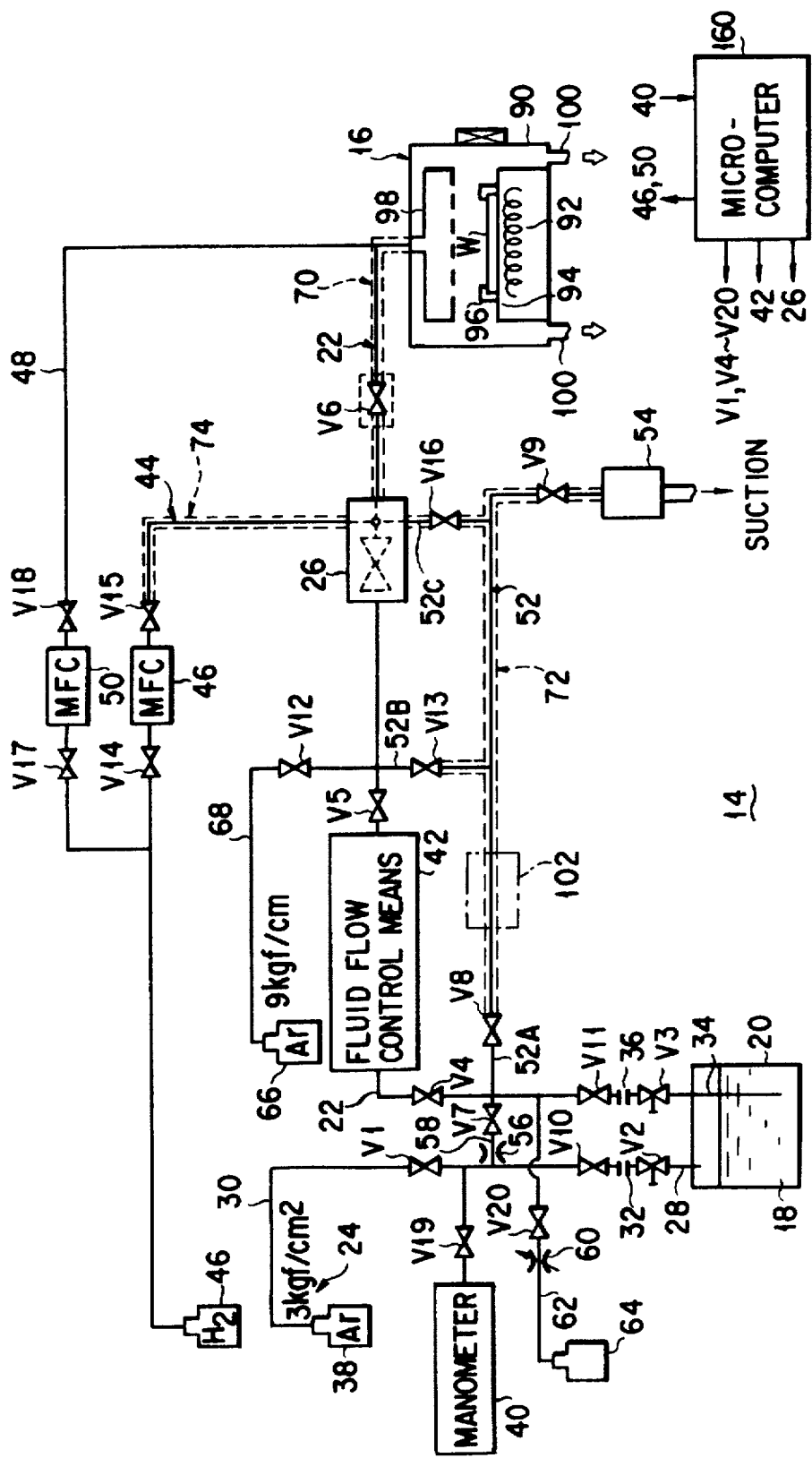
FIG. 1 is a view, showing the circuit structure of a process gas supply apparatus according to the embodiment of the invention.

FIG. 1 shows a process gas supply apparatus 14 for supplying a process gas to a process device 16 which forms a film, etc. on a treatment object such as a semiconductor wafer W.

In this embodiment, the process device 16 is a so-called one-by-one type CVD film-forming device for processing semiconductor wafers W one by one. This device 16 forms an aluminum film on a semiconductor wafer W using an organic aluminum metallic compound (DMAH in this embodiment). The process device 16 has a process container 90 made of e.g. aluminum. The process container 90 contains a mount table 94 to be heated, for example, by a resistive heater 92. The mount table 94 holds thereon a wafer W by means of e.g. a mechanical clamp 96. The mechanical clamp 96 may be replaced with an electrostatic chuck. A shower head 98 is provided in the process container 90 directly above the mount table 94. The shower head 98 is connected to a process gas supply pipe line 22 incorporated in the process gas supply device 14 which will be described later. Exhaust vents 100 connected to a vacuum pump (not shown) are provided in the bottom of the process container 90 such that gases in the container 90 can be exhausted.

The process gas supply device 14 mainly comprises a liquid container 20 which contains a liquid material (DMAH) 18 from which a process gas for film forming is created, the aforementioned supply pipe line 22 connecting the liquid container 20 to the process device 16, force feed means 24 for force-feeding the liquid material 18 toward the supply pipe line 22, and vaporizing means 26 provided across the supply pipe line 22 for vaporizing the force-fed liquid material 18 to create the process gas.

The liquid container 20 is a sealed container made of e.g. stainless steel and having a capacity of about 8l. The inner wall surface of the liquid container 20 is beforehand electrolytically polished so as to prevent adhesion of gases or moisture thereto. An end portion of a gas introduction pipe 28 across which an manual open-close valve V2 is provided is introduced into the liquid container 20 above the surface of the liquid material 18.

The force-feed means 24 consists of a chemical cylinder 38 filled with Ar gas having a high pressure of e.g. 1 to 3 kgf/cm$^2$, and a force-feed pipe 30 connected to the cylinder. The force-feed pipe 30 is also connected to the other end of the gas introduction pipe 28 via a joint 32. Thus, highly-pressurized Ar gas can be supplied from the chemical cylinder 38 to the container 20 via the force-feed pipe 30. Switching valves V1 and V10 are provided in this order across the force-feed pipe 30 so that the liquid material 18 can be supplied under 1 to 3 kgf/cm$^2$. A manometer 40 consisting of e.g. a capacitance manometer is connected, by means of a communication pipe with an open-close valve V19, to that portion of the force-feed pipe 30 which is located between the open-close valves V1 and V10.

An end portion of a liquid leading pipe 34 across which a manual open-close valve V3 is provided is introduced into the liquid material 18 in the liquid container 20. Another end portion of the pipe 34 is located outside the liquid container 20 and connected to the supply pipe line 22 via a joint 36.

The supply pipe line 22 is formed of a steel pipe. Across the supply pipe line 22, an open-close valve V11, an open-close valve V4, liquid flow control means 42 for controlling the flow of the liquid material 18 flowing through the line 22, an open-close valve V5, the vaporizing means 26 and an open-close valve V6 are provided in the order mentioned between the upstream side and the downstream side with respect to the flow of the liquid material 18. In this structure, the liquid material 18 flows in the state of liquid upstream of the vaporizing means 26, and in the state of gas downstream of the vaporizing means 26. The liquid flow control means 42 is formed of a mass-flow controller for liquids, or a micro pump which has a plurality of valve bodies therein and can accurately control the flow of only a small amount of a liquid (for example, even in the case of a flow rate of about 0.5 CCM).

The inner diameter of that portion of the supply pipe line 22 which is located between the joint 36 and the vaporizing means 26 is set to e.g. ¼ inch, which is sufficient to control the flow of a very small amount of liquid and not to cause excessive pressure loss of the liquid material 18 flowing therethrough. Further, the inner diameter of that portion of the supply pipe line 22 which is located between the vaporizing means 26 and the process device 16 is set to e.g. ⅜ or ½ inch, which enables a process gas to flow easily with a low fluid resistance. The inner wall surface of the supply pipe line 22 is beforehand electrolytically polished to reduce the amount of adhesion of moisture, etc. thereto and thereby prevent unnecessary chemical reaction with DMAH.

The vaporizing means 26 is connected, via a carrier gas pipe 44, a hydrogen gas cylinder 46 which contains hydrogen gas as a carrier gas. Across the gas pipe 44, an open-close valve V14, a mass-flow controller 46 and an open-close valve V15 are provided in this order between the upstream side and the downstream side. Thus, hydrogen gas supplied to the vaporizing means 26 serves as both a vaporizing gas and a carrier gas.

A chamber pressure adjustment pipe 48 is diverted from an upstream-side portion of the gas pipe 44, and connected to that portion of the supply pipe line 22 which is located close to the process device 16. Across the chamber pressure adjustment pipe 48, an open-close valve V17, a mass-flow controller 50 and an open-close valve V18 are provided in this order between the upstream side and the downstream side. Thus, the pressure in the process device 16 can be adjusted before the process gas is supplied thereto, thereby realizing the supply of the process gas with its flow accurately controlled.

A trap pipe 52 connected to a vacuum pump (not shown), etc. for discharging DMAH using a negative pressure has a downstream end portion across which an open-close valve V9 and a trap unit 54 are provided in this order. Further, the trap pipe 52 includes first through third pipe portions 52A, 52B and 52C diverted from an upstream end portion thereof. The first pipe portion 52A is connected to that portion of the supply pipe line 22 which is located upstream of the open-close valve V4, and an open-close valve V8 is provided across the pipe portion 52A. The second pipe portion 52B is connected to that portion of the supply pipe line 22 which is located downstream of the open-close valve V5, and an open-close valve V13 is provided across the pipe portion 52B. The third pipe portion 52C is connected to the vaporizing means 26, and an open-close valve V16 is provided across the pipe portion 52C.

That portion of the force-feed pipe 30 which is located downstream of the open-close valve V1 is connected, by means of a communication pipe 58, to that portion of the supply pipe line 22 which is located downstream of the open-close valve V11. An open-close valve V7 and a restriction valve 56 are provided across the communication pipe 58.

To purge DMAH using a solvent at the time of cleaning the pipe system, a solvent tank 64 is connected, via a solvent purge pipe 62, to that portion of the supply pipe line 22 which is located downstream of the open-close valve V11. The solvent tank 64 contains a solvent for dissolving DMAH, for example, normal hexane. An open-close valve V20 and a restriction valve 60 capable of adjusting its valve opening are arranged across the solvent purge pipe 62. To remove DMAH in the vaporizing means 26 a purging Ar gas source 66 is connected, via a purge pipe 68 with an open-close valve V12, to that portion of the supply pipe line 22 which is located downstream of the open-close valve V5. The purging pressure of the Ar gas source 66 is set to 6 to 9 kgf/cm$^2$.

That portion of the supply pipe line 22 which is located between the vaporizing means 26 and the process device 16 is entirely wound by a gas heater 70 consisting of e.g. a tape heater, as is indicated by the broken lines in FIG. 1. The heating temperature of the gas heater 70 is set to a constant value falling within a range of 30° to 90° C., e.g. 60° C., at which temperature vaporized DMAH is neither returned to the liquid state, nor thermally decomposed. To prevent solidification of DMAH which is to be discharged through the trap pipe 52, that portion of the trap pipe 52 which is located upstream of the trap unit 54 is entirely wound by a first heater 72 consisting of e.g. a tape heater, as is indicated by the broken lines in FIG; 1. The heating temperature of the heater 72 is set to e.g. 45° C. In addition, to preheat a carrier gas flowing through the carrier gas pipe 44 so as to accelerate vaporization of the liquid material 18, a downstream portion of the carrier gas pipe 44 is entire wound by a second heater 74 consisting of e.g. a tape heater, as is indicated by the broken lines in FIG. 1. The heating temperature of the heater 74 is set to e.g. 35° C.

The liquid flow control means 42, the vaporizing means 26, the mass-flow controllers 46 and 50 and valves V1 to V20 (except for the valves V2 and V3) are controlled by a microcomputer 160. A carrier gas of an amount sufficient to vaporize the liquid material 18 is supplied at all times to the vaporizing means 26.

Figure 2:
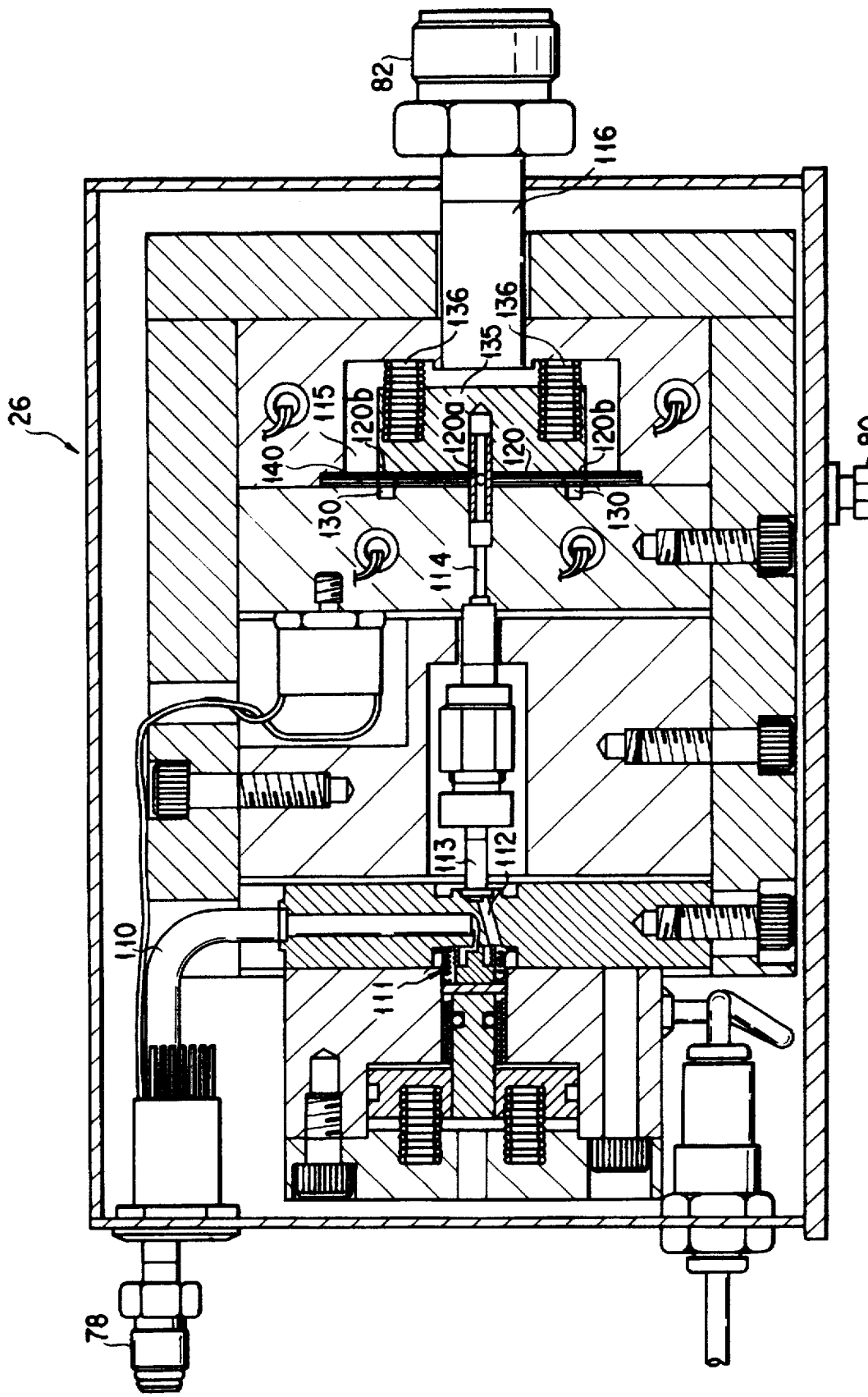
FIG. 2 is a sectional view, showing vaporizing means provided across a supply pipe line incorporated in the process gas supply apparatus of FIG. 1.

FIG. 2 shows the structure of the vaporizing means 26. As is shown in FIG. 2, the means 26 has a liquid introduction port 78 for introducing the liquid material (DMAH) 18 supplied through the supply pipe line 22, a carrier gas introduction port 80 for introducing H$_2$ as the carrier gas supplied through the gas pipe 44, and a process gas exhaustion port 82. The main body of the vaporizing means 26 includes a vaporizing section 140 with 101 vaporizing disks 120 arranged adjacent to each other, passages 110, 112, 113 and 114 for guiding, to the vaporizing section 140, the liquid material 18 introduced into the vaporizing means 26 through the liquid introduction port 78, a valve mechanism 111 interposed between the passages 110, 112, 113 and 114 (between the passages 110 and 112 in this embodiment), a passage (not shown) for guiding, to the vaporizing section 140, the carrier gas introduced into the vaporizing means 26 through the carrier gas introduction port 80, and a annular groove 130 formed at an end portion of this passage.

Each vaporizing disk 120 employed in the vaporizing section 140 has a single liquid material passing hole 120a formed in a center portion thereof, and a plurality of carrier gas passing holes 120b formed around the passing hole 120a. The vaporizing disks 120 are arranged adjacent to each other such that the liquid material passing hole 120a corresponds to the passage 114, and the carrier gas passing holes 120b correspond to the annular groove 130. These disks are urged by an anvil 135 which contacts a compression spring 136, such that they are brought into contact with each other.

In the above-described structure, the liquid material 18 introduced into the vaporizing means 26 through the liquid introduction port 78 passes the passage 110, the valve mechanism 111 and the passages 112, 113 and 114, which are formed in the main body of the means 26, and then enters clearances between the vaporizing disks 120 through the liquid material passing hole 120a. On the other hand, the carrier gas introduced into the vaporizing means 26 through the carrier gas introduction port 80 enters the clearances between the vaporizing disks 120 through the passage (not shown), the annular groove 130 and the carrier gas passing holes 120b. In the clearances of the between the vaporiizng disks 120, a pressure drop occurs because of the carrier gas, whereby the liquid material 18 is vaporized as a result of the Joule-Thomson effect. The vaporized material 18, which serves as the process gas, passes exhaustion passages 115 and 116 together with the carrier gas, reaches a downstream portion of the supply pipe line 22 through the process gas exhaustion port 82, and enters the process device 16.

The operation of the apparatus constructed as above will now be described.

First, where the open-close valve V6 of the supply pipe line 22 and the open-close valve V18 of the chamber pressure adjustment pipe 48, which are incorporated in the process gas supply apparatus 14, are closed, a semiconductor wafer W to be treated is transferred to the process container 90 and mounted onto the mount table 94. Subsequently, the pressure in the process container 90 is reduced to a base negative value, and the wafer W is heated by the resistive heater 92 to a predetermined temperature falling within a process temperature range (for example, 160° to 300° C.), e.g. 200°.

Then, to minimize the range of changes in supply amount of the process gas due to changes in pressure in the process container 90, the open-close valves V17 and V18 arranged across the chamber pressure adjustment pipe 48 are opened before the process gas is supplied into the process container 90, thereby supplying the process container 90 with H$_2$ gas from the shower head 98 via the chamber pressure adjustment pipe 48. As a result, the pressure in the process container 90 is set to a predetermined value, e.g. about 2 Torr, falling within a process pressure range (0.1 to 20 Torr).

After setting the pressure in the process container 90, the open-close valves V1 and V10 arranged across the force-feed pipe 30, the open-close valve V2 of the gas introduction pipe 28, the open-close valve V3 of the liquid introduction pipe 34, and the open-close valves V11, V4 and V5 arranged across the supply pipe line 22 are opened. At the same time, the valves V14 and V15 arranged across the carrier gas pipe 44 are opened. In this state, Ar gas pressurized to 1 to 3 kgf/cm$^2$ is guided from the Ar gas cylinder 38 to the liquid material container 20 via the force-feed pipe 30. By virtue of the pressurized Ar gas, the liquid material 18 contained in the container 20 is smoothly guided through the supply pipe line 22. In this case, an inactive gas other than Ar gas, for example, He gas or Xe gas, may be used.

The liquid material 18 guided through the supply pipe line 22 has its flow controlled by the liquid flow control means 42, before it reaches the vaporizing means 26. In the vaporizing means 26, the liquid material 18 is vaporized, as a result of the Joule-Thomason effect, into a process gas in the atmosphere of highly pressurized $H_2$ gas, which is supplied as a carrier gas from the $H_2$ gas cylinder 46 to the vaporizing means 26 via the carrier gas pipe 44. At the beginning of vaporization of the liquid material 18 in the vaporizing means 26, the flow of the liquid material 18 supplied thereto is gradually (not stepwise) increased to a predetermined value. To increase the flow of the liquid material in a stepwise manner, pre-flow is performed, in which the process gas is discharged to the outside of the system through the pipe portion 52C of the trap pipe 52 with the open-close valve V6 closed, before it is introduced into the process device 16 through the valve V6.

After the pre-flow is performed for a predetermined period of time, the open-close valve V18 of the chamber pressure adjustment pipe 48 is closed to stop the supply of $H_2$ gas into the process container 90, while the open-close valve V16 of the pipe portion 52C of the trap pipe 52 is closed and the open-close valve V6 is opened, thereby introducing the process gas into the process container 90 to start film forming.

As described above, performing the pre-flow for a predetermined period of time with the pressure in the container 90 kept at a process pressure through the chamber pressure adjustment pipe 48, before the process gas is introduced into the container 90 enables the process gas having its flow controlled accurately in a stepwise manner to be introduced into the process container 90 upon starting the processing, without causing a change in pressure in the container 90.

The process gas created in the vaporizing means 26 is carried by the carrier gas, i.e. $H_2$ gas, to the process device 16 via the open-close valve V6, and introduced into the process container 90 through the shower head 98. At this time, the vaporizing means 26 and that portion of the supply pipe line 22 which is located downstream of the vaporizing means 26 are heated, for example, by the built-in gas heater 70 to a predetermined temperature, e.g. 60° C., falling within a temperature range (e.g. 30° to 90° C.) which is higher than the vaporization temperature of DMAH and lower than the thermal decomposition temperature thereof. Therefore, vaporized DMAH gas, i.e. the process gas, is prevented from returning to the liquid state or turning to a thermally decomposed state, and is hence smoothly supplied to the process device 16 through the supply pipe line 22. On the other hand, the carrier gas introduced into the vaporizing means 26 through the carrier gas pipe 44 is preheated by the second heater 74 provided on the pipe 44, to a temperature (e.g. about 60° C.) falling within a range of 30° to 90° C., which is slightly lower than a temperature at which the process gas is kept in the gas state. Therefore, the liquid material 18 can be vaporized promptly and smoothly. An inactive gas other than $H_2$ gas, for example, Ar gas or He gas, may be used as the carrier gas.

As described above, the process gas supply apparatus 14 according to the embodiment, which supplies the process gas under the accurate flow control, can supply a greater amount of process gas than the conventional apparatus. More specifically, the conventional apparatus can supply the process gas at a flow rate of 4 SCCM at maximum. On the other hand, the process gas supply apparatus 14 of the embodiment can supply the process gas at a flow rate required to form an Al film on a single wafer W at the time of mass production of semiconductor devices, e.g. at a flow rate of about 100 SCCM (about 0.35 CCM in terms of liquid flow rate). Accordingly, Al film forming by CVD can be performed on a mass-production basis.

When the film forming is stopped, the open-close valve V6 of the supply pipe line 22 is closed, and the open-close valve V16 of the pipe portion 52C of the trap pipe 52, which is connected to the vaporizing means 26, is opened, thereby exhausting through the pipe portion 52C the process gas having flown so far to the process container 90. As a result, the supply of the process gas can be stopped in a stepwise manner, which will not adversely affect the film forming.

When the liquid material 18 contained in the liquid container 20 is all used as a result of repetition of the film forming processing, the container 20 must be exchanged for another filled with the liquid material 18. Further, the supply pipe line 22, or the liquid flow control means 42 or the vaporizing means 26 arranged across the pipe line 22 must be inspected regularly or irregularly. At the time of performing such exchange or inspection, it should be noted that the liquid material 18 still remains in the pipe line 22, in those end portions of the pipe line 22 which are close to the joints 32 and 36, or in the flow control means 42 or the vaporizing means 26. As aforementioned, the liquid material 18 furiously reacts when it is exposed to the air. In light of this, it is necessary before the above-described maintenance working to remove the liquid material 18 from an area where the maintenance working is performed. However, the liquid material 18 has a very high viscosity of about 8000 to 10000 cp at an ordinary temperature, and therefore it is hard to completely purge the liquid material 18 only by a pressurized gas. In consideration of this, in the process gas supply apparatus 14 of the embodiment, the liquid material 18 is eliminated by a solvent. A method for eliminating the liquid material 18 from the process gas supply apparatus by cleaning will now be described.

Referring first to FIG. 1 and the flowchart of FIG. 3, a method for purging the liquid material 18 from the liquid container 20 before exchange of the liquid container 20 for another one will be described.

At the time of exchange of the liquid container 20, the open-close valve V2 of the gas introduction pipe 28 and the open-close valve V3 of the liquid leading pipe 34 are closed. Moreover, the first heater 72 provided on the first through third pipe portions 52A, 52B and 52C of the trap pipe 52 is supplied with power, thereby heating the trap pipe 52 to a temperature, e.g. 45° C., at which DMAH is not liquidized nor decomposed (S1).

Subsequently, the open-close valves V1 and V10 of the force-feed pipe 30, the open-close valve V7 of the communication pipe 58, the open-close valve V11 of the supply pipe line 22, and the open-close valves V8 and V9 of the trap pipe 52 are opened, while the other valves are closed. In this state, Ar gas with a pressure of e.g. 3 kgf/cm$^2$, which serves as a purge gas, is supplied from the Ar gas cylinder 38. Ar gas flows through those portions of the pipe line which communicate with each other via the valves V1 and V7 to V11, thereby to purge, to the outside of the supply system through the pipe portion 52A of the trap pipe 52, the liquid material 18 remaining in that upstream portion of the supply pipe line 22 which is connected to the container 20 (S2). The purged liquid material 18 is trapped by the trap device 54.

Since the liquid material 18 has a very high viscosity, it cannot sufficiently be purged only by the purging processing using Ar gas. Thus, considerable part of the liquid material 18 is kept sticking to the inner wall of the pipe line 22. To completely remove the liquid material 18, a solvent is introduced into pipes.

To introduce the solvent, first the open-close valve V1 is closed to thereby stop the supply of Ar gas. Subsequently, the pipes which communicate with each other via the open-close valves V7 to V11 are exhausted by a negative pressure for a predetermined period of time (S3). Thereafter, the open-close valve V8 of the pipe portion 52A of the trap pipe 52 is closed to thereby interrupt the trap pipe 52 from the supply pipe line 22. At the same time, the open-close valve V20 arranged across the purge pipe 62 is opened to supply normal hexane, the solvent, from the solvent tank 64. As a result, the solvent is introduced into the upstream portion of the supply pipe line 22 which is connected to the container 20 (S4). After the upstream portion of the line 22 is sufficiently filled with the solvent, the open-close valve V20 is closed to stop the supply of the solvent. This state is kept for a predetermined period of time, e.g. about 10 minutes, in order to promote dissolution of the remaining liquid material 18 (S5).

After the predetermined period of time, the open-close valve V8 is opened to thereby discharge the solvent through the pipe portion 52A of the trap pipe 52 (S6). To discharge the solvent, it may be modified such that greater part of the solvent is purged by the purge gas supplied from the Ar gas cylinder 38, and then the remaining solvent is eliminated by a negative pressure.

It is convenient if the liquid material 18 is completely purged by a single cleaning operation using the solvent. Usually, however, it cannot be completely removed by a single cleaning operation, and hence the processing in the steps S4 to S6 is repeated a predetermined number of times (e.g. 3 to 5 times)

After the introduction and discharge of the solvent is repeated the predetermined number of times, the open-close valve V19 is opened to check, by means of the manometer 40, the pressure in the upstream portion of the supply pipe line 22 connected to the container 20 (S8). If it is determined by the manometer 40 that the pressure in the upstream portion of the pipe line 22 reaches a predetermined negative value, the open-close valves V10 and V11 arranged across the joints 32 and 36 are closed.

In this state, the liquid material 18 does not exist in the upstream portion of the supply pipe line 22 connected to the container 20, and hence the operator can exchange the empty container 20 for a new one by detaching the joints 32 and 36 (S9).

As described above, the process gas supply apparatus 14 of the embodiment can substantially completely remove the liquid material 18 which remains in the upstream portion of the pipe line 22 connected to the container 20, by cleaning the line with a solvent. Thus, it is not dangerous to expose to the air the line portion connected to the container 20, and accordingly exchange of the container 20 can be performed safely. To more facilitate the discharge of the remaining liquid material 18, a third heater (not shown) may be provided on that portion of the supply pipe line 22 which is located between the joint 36 and the open-close valve V4, in order to heat this portion of the line 22 to substantially the same temperature, i.e. about 45° C., as the pipe portion 52A of the trap pipe 52.

Figure 4:
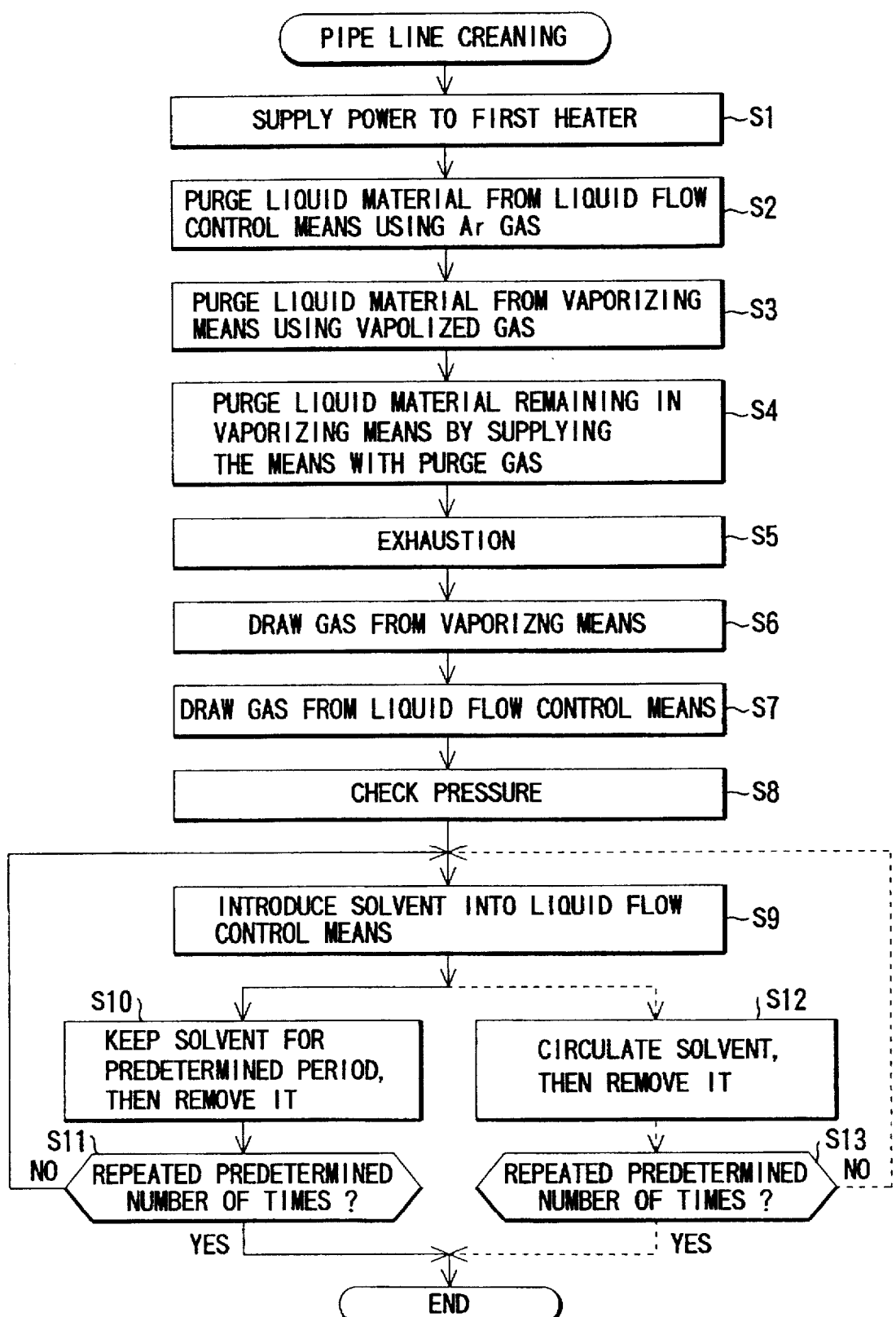
FIG. 4 is a flowchart, illustrating a procedure of purging a liquid material, by cleaning, at the time of inspecting the process gas supply apparatus of FIG. 1.
Figure 5A:
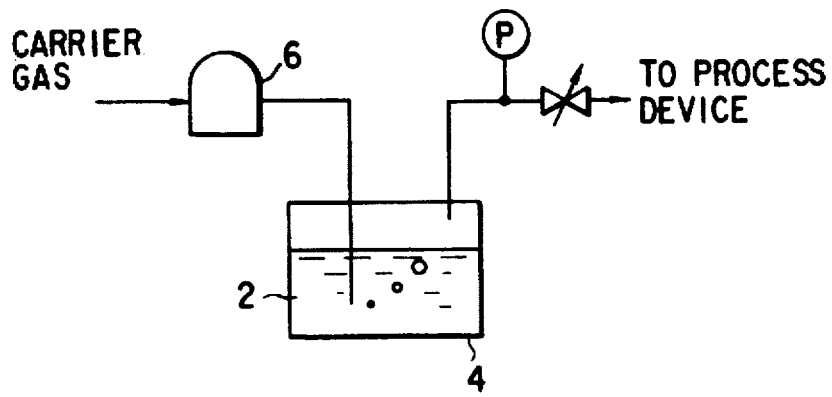
FIG. 5A is a view, showing a conventional bubbling method for vaporizing a liquid material into a process gas to be supplied.
Figure 5B:
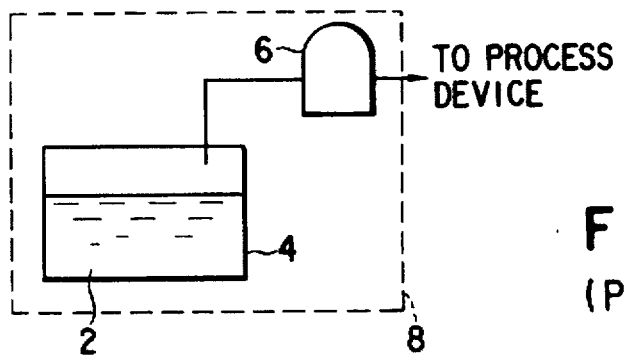
FIG. 5B is a view, showing a conventional baking method for vaporizing a liquid material into a process gas to be supplied.
Figure 5C:
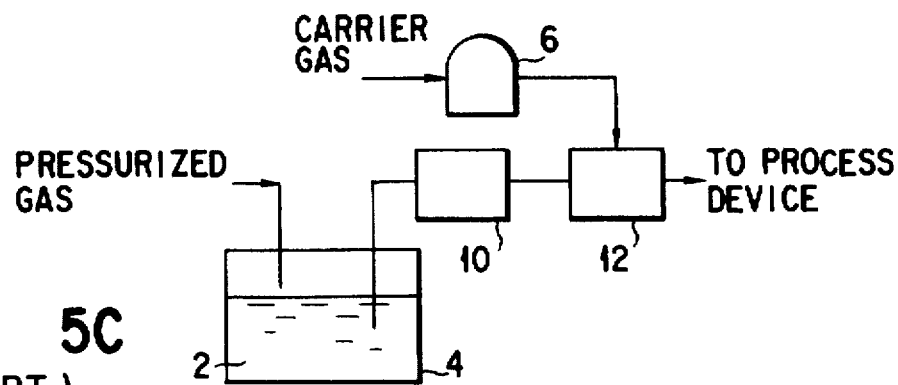
FIG. 5C is a view, showing a conventional direct vaporization method for vaporizing a liquid material into a process gas to be supplied.

Referring then to FIG. 1 and the flowcharts of FIG. 4, a method for eliminating the liquid material 18 by cleaning to inspect the supply pipe line 22, the liquid flow control means 42 and the vaporizing means 26 will be described.

At the time of maintenance working, in order to reduce the viscosity of the liquid material 18 and facilitate its discharge, the first heater 72 provided on the pipe portions 52A, 52B and 52C of the trap pipe 52 is supplied with power to heat the pipe portions 52A, 52B and 52C to 45° C. (S1).

Subsequently, the open-close valve V1 of the force-feed pipe 30, the open-close valve V7 of the communication pipe 58, the open-close valves V4 and V5 of the supply pipe line 22, and the open-close valves V13 and V9 of the trap pipe 52 are opened, while the other valves are closed. In this state, Ar gas with a pressure of e.g. 3 kgf/cm$^2$, which serves as a purge gas, is supplied from the Ar gas cylinder 38. Ar gas flows through those portions of the pipe line which communicate with each other via those valves, thereby to purge, to the outside of the supply system through the pipe portion 52B of the trap pipe 52, the liquid material 18 remaining in the liquid flow control means 42 and those portions of the supply pipe line 22 which extend upstream and downstream of the means 42 (S2).

Thereafter, while the open-close valve V9 is kept open, the other open-close valves V1, V7, V4, V5 and V13 are closed. In this state, the open-close valves V14 and V15 of the carrier gas pipe 44 and the open-close valve V16 of the pipe portion 52C of the trap pipe 52 are opened to thereby introduce the carrier gas (i.e. H$_2$ gas) as the purge gas from the hydrogen gas cylinder 46 into the vaporizing means 26. As a result, the liquid material 18 remaining in the vaporizing means 26 is vaporized and discharged to the outside of the supply system through the pipe portion 52C of the trap pipe 52 (S3).

Then, in this state, the open-close valve V12 arranged across the purge pipe 68 is opened, thereby introducing Ar gas with a pressure of e.g. 9 kgf/cm$^2$ into the vaporizing means 26 from the Ar gas source 66. As a result, the liquid material 18 still remaining in the vaporizing means 26 is substantially completely vaporized and discharged from the pipe portion 52C of the trap pipe 52 to the outside of the supply system (S4). Since in this case, the pressure of Ar gas is set at a very high level of 9 kgf/cm$^2$, even if the vaporizing means 26 is chocked with the liquid material 18, the material 18 can substantially completely be eliminated. In addition, if at this time, the supply of Ar gas and the stop of the supply are repeated by repeating the opening and closing of the open-close valve V12, the anvil 135 (FIG. 2) in the vaporizing means 26 is operated by the gas pressure to thereby completely purge the remaining liquid material 18.

Thereafter, the vaporizing means 26 is exhausted by a negative pressure through the pipe portion 52C of the trap pipe 52 (S5), and the open-close valve V15 is closed to stop the supply of H$_2$ gas as the vaporizing gas. Further, the open-close valves V12 and V16 are successively closed. Then, the open-close valve V13 of the pipe portion 52B of the trap pipe 52 is opened to draw highly pressurized Ar gas out of the vaporizing means 26 (S6). Moreover, the open-close valves V4, V7, V8, V10 and V11 are opened to draw highly pressurized Ar gas out of the supply pipe line 22 and the liquid flow control means 42 (S7).

When a predetermined period of time has elapsed after the above-described processing, and the gas pressure has balanced, the open-close valve V19 is opened, and the pressure in the supply pipe line 22 is measured by the manometer 40 (S8). If it is determined by the manometer 40 that the pressure in the pipe line 22 reaches a predetermined negative value, the open-close valves V19, V7, V8, V10 and V11 are closed, and the open-close valve V20 of the solvent purging pipe 62 is opened with the open-close valve V4 of the supply pipe line 22 kept open. As a result, normal hexane is introduced from the solvent tank 64 into the liquid flow control means 42 (S9). This state is kept as it is for a predetermined period of time, e.g. about 10 minutes, in order to promote dissolution of the remaining liquid material 18.

Thereafter, the open-close valve V5 is opened to purge the solvent to the outside of the supply system through the pipe portion 52B of the trap pipe 52 (S10). At this time, Ar gas may be supplied from the Ar gas cylinder 38 to promote the discharge of the solvent, as in the case of exchanging the liquid container 20.

If the liquid material 18 cannot sufficiently be removed by a single cleaning operation using the solvent, the processing in the steps S9 and S10 is repeated a predetermined number of times (S11), followed by the completion of the cleaning. Thereafter, other predetermined maintenance working is performed.

As described above, the process gas supply apparatus of the embodiment can substantially completely purge the liquid material 18 remaining in an area to be inspected, by dissolving it with a solvent introduced thereinto after purging greater part of the liquid material 18 therefrom by a purge gas. This enables maintenance working to be performed safely.

Although in the above-described cleaning processing for maintenance, the solvent is left in the liquid flow control means 42 for a predetermined time period to promote dissolution of the remaining liquid material 18, the invention is not limited to this. For example, the solvent may be circulated through an area to be cleaned. In this case, as indicated by the single-dot chain line in FIG. 1, a circulation pump 102 may be provided across that portion of the pipe portion 52A of the trap pipe 52 which is located downstream of the open-close valve V8, thereby performing processing in accordance with the flowchart indicated by the broken lines in FIG. 4. More specifically, after introducing the solvent into the liquid flow control means 42, the open-close valve V7 is closed, and the open-close valves V8, V13 and V5 are opened, thereby forming a closed loop which includes the circulation pump 102. The solvent is circulated through the liquid flow control means 42 by driving the pump 102 to thereby promote dissolution of the remaining liquid material 18. After circulating the solvent for a predetermined period of time, the solvent is discharged to the outside of the supply system (S12). If the remaining liquid material 18 is sufficiently eliminated by a single cleaning operation, the cleaning processing may be finished. However, to more completely purge the liquid material 18, introduction and circulation of the solvent to purge the liquid material 18 is repeated a predetermined number of times (S13). This cleaning processing can reduce the amount of the solvent and the time required for cleaning, and more completely purge the liquid material 18, as compared with the first-mentioned cleaning processing in which the solvent is not circulated.

Although in the above-described embodiment, DMAH is used as an organic aluminum metallic compound, DMEAA (dimethylethylamine aluminum), TMEAA (trimethylamine aluminum), TMA (trimethyl aluminum), etc. may be used instead of DMAH. Moreover, the solvent for dissolving the liquid material 18 may be any organic solvent which has a lone electron-pair. Other than normal hexane, examples of hexane includes isomers such as methyl diethyl methane, dimethyl propyl methane, dimethyle isopropyl methane, trimethylethyl methane, etc. As other solvents, toluene, benzen, etc. may be used singly or in combination. In addition, it is a matter of course that the process gas supply apparatus 14 of the embodiment is applicable to forming a film not only on a semiconductor wafer, but also on an LCD substrate or a glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A process gas supply apparatus comprising:
   a supply pipe line connecting a supply source containing an organic aluminum metallic compound in a liquid state, to a process device for forming a film on an object using the organic aluminum metallic compound;
   force-feed means for force-feeding, through the supply pipe line, the organic aluminum metallic compound contained in the supply source;
   vaporizing means provided across the supply pipe line for vaporizing the force-fed organic aluminum metallic compound of the liquid state;
   purge gas introduction means connected to the supply pipe line for introducing a pressurized purge gas into the supply pipe line;
   solvent introduction means connected to the supply pipe line for introducing into the supply pipe line a solvent for dissolving the organic aluminum metallic compound;
   exhaustion means connected to the supply pipe line for exhausting the supply pipe line by a negative pressure; and
   control means having a plurality of valves arranged across the supply pipe line, and controlling the flow of fluids flowing through the supply pipe line by opening and closing the valves.

2. The process gas supply apparatus according to claim 1, wherein the control means includes first switching means for guiding the organic aluminum metallic compound force-fed from the supply source, to the process device through the supply pipe line, and second switching means for guiding the purge gas from the purge gas introduction means, to the exhaustion means through the supply pipe line, and then guiding the solvent from the solvent introduction means, to the exhaustion means through the supply pipe line.

3. The process gas supply apparatus according to claim 2, wherein the second switching means temporarily stores the solvent in the supply pipe line, and then guides the solvent to the exhaustion means.

4. The process gas supply apparatus according to claim 2, wherein the second switching means circulates the solvent through the supply pipe line, and then guides the solvent to the exhaustion means.

5. The process gas supply apparatus according to claim 2, wherein the first switching means performs pre-flow processing in which the organic aluminum metallic compound vaporized by the vaporizing means is temporarily guided to the exhaustion means, and then guides the organic aluminum metallic compound vaporized by the vaporizing means, to the process device.

6. The process gas supply apparatus according to claim 2, wherein the control means has third switching means for guiding the purge gas from the purge gas introduction means, to the exhaustion means via the vaporizing means.

7. The process gas supply apparatus according to claim 1, further comprising flow control means provided across the supply pipe line for controlling the flow of the force-fed organic aluminum metallic compound of the liquid state.

8. The process gas supply apparatus according to claim 7, wherein the control means includes first switching means for guiding the organic aluminum metallic compound force-fed from the supply source, to the process device through the supply pipe line, and fourth switching means for guiding the purge gas from the purge gas introduction means, to the exhaustion means through the flow control means, and then guiding the solvent from the solvent introduction means, to the exhaustion means through the flow control means.

9. The process gas supply apparatus according to claim 8, wherein the fourth switching means temporarily stores the solvent in the flow control means, and then guides the solvent to the exhaustion means.

10. The process gas supply apparatus according to claim 1, further comprising pressure adjustment means connected to the process device for supplying a gas to a process chamber of the process device to adjust the pressure in the process chamber.

11. The process gas supply apparatus according to claim 10, wherein the pressure adjustment means serves as the purge gas introduction means, too.

12. The process gas supply apparatus according to claim 1, wherein the force-feed means serves as the purge gas introduction means, too.

13. The process gas supply apparatus according to claim 1, further comprising heating means for heating that portion of the supply pipe line which is located between the vaporizing means and the process device, to a temperature at which the vaporized organic aluminum metallic compound is neither liquidized again nor thermally decomposed.

14. The process gas supply apparatus according to claim 1, further comprising heating means for heating the exhaustion means to a temperature at which the vaporized organic aluminum metallic compound is neither liquidized again nor thermally decomposed.

15. The process gas supply apparatus according to claim 1, wherein the supply pipe line is disconnectably connected to the supply source.

16. The process gas supply apparatus according to claim 1, wherein the organic aluminum metallic compound is selected from the group consisting of dimethyl aluminum hydride, dimethylethylamine aluminum, trimethylamine aluminum and trimethyl aluminum.

17. The process gas supply apparatus according to claim 1, wherein the solvent is an organic solvent having a lone electron-pair.

18. The process gas supply apparatus according to claim 1, wherein the solvent is selected from the group consisting of hexane, toluene, benzen and a mixture thereof.

19. A method of cleaning a process gas supply apparatus for vaporizing a liquid organic aluminum metallic compound and supplying a process device with the vaporized organic aluminum metallic compound as a process gas, comprising the steps of:

introducing a pressurized purge gas into a supply pipe line incorporated in the process gas supply apparatus for force-feeding the organic aluminum metallic compound to the process device, or into a unit arranged across the supply pipe line, and purging, by the pressurized purge gas, the organic aluminum metallic compound remaining in the supply pipe line or the unit; and introducing into the supply pipe line or the unit a solvent for dissolving the organic aluminum metallic compound, after purging the organic aluminum metallic compound from the supply pipe line or the unit by the purge gas, and then discharging the organic aluminum metallic compound together with the solvent from the supply pipe line or the unit.

20. A method of cleaning a process gas supply apparatus for vaporizing a liquid organic aluminum metallic compound and supplying a process device with the vaporized organic aluminum metallic compound as a process gas, comprising the steps of:

introducing a pressurized purge gas into a supply pipe line incorporated in the process gas supply apparatus for force-feeding the organic aluminum metallic compound to the process device, or into a unit arranged across the supply pipe line, and purging, by the pressurized purge gas, the organic aluminum metallic compound remaining in the supply pipe line or the unit;

introducing into the supply pipe line or the unit a solvent for dissolving the organic aluminum metallic compound, after purging the organic aluminum metallic compound from the supply pipe line or the unit by the purge gas, and temporarily keeping the solvent in the supply pipe line or the unit; and discharging the organic aluminum metallic compound together with the solvent from the supply pipe line or the unit after temporarily keeping the solvent therein.

21. A method of cleaning a process gas supply apparatus for vaporizing a liquid organic aluminum metallic compound and supplying a process device with the vaporized organic aluminum metallic compound as a process gas, comprising the steps of:

introducing a pressurized purge gas into a supply pipe line incorporated in the process gas supply apparatus for force-feeding the organic aluminum metallic compound to the process device, or into a unit arranged across the supply pipe line, and purging, by the pressurized purge gas, the organic aluminum metallic compound remaining in the supply pipe line or the unit;

introducing into the supply pipe line or the unit a solvent for dissolving the organic aluminum metallic compound, after purging the organic aluminum metallic compound from the supply pipe line or the unit by the purge gas, and circulating the solvent in the supply pipe line or the unit; and discharging the organic aluminum metallic compound together with the solvent from the supply pipe line or the unit after circulating the solvent therein.

* * * * *